United States Patent
Xu et al.

(10) Patent No.: US 10,961,383 B2
(45) Date of Patent: Mar. 30, 2021

(54) GRADIENT BLOCK COPOLYMERS FOR DIRECTED SELF-ASSEMBLY

(71) Applicant: Brewer Science, Inc., Rolla, MO (US)

(72) Inventors: Kui Xu, Rolla, MO (US); Richard Elsworth Daugherty, Jr., Bland, MO (US); Daniel Patrick Sweat, Rolla, MO (US); Mary Ann Hockey, Rolla, MO (US); Eric Calderas, Rolla, MO (US); Megan Bennett, Rolla, MO (US)

(73) Assignee: Brewer Science, Inc., Rolla, MO (US)

(*) Notice: Subject to any disclaimer, the term of this patent is extended or adjusted under 35 U.S.C. 154(b) by 104 days.

(21) Appl. No.: 16/133,051

(22) Filed: Sep. 17, 2018

(65) Prior Publication Data
US 2019/0233636 A1 Aug. 1, 2019

Related U.S. Application Data

(60) Provisional application No. 62/624,960, filed on Feb. 1, 2018.

(51) Int. Cl.
*C08L 53/00* (2006.01)
*C08F 20/18* (2006.01)
*C08F 26/06* (2006.01)
*C08G 63/06* (2006.01)
*C08F 20/26* (2006.01)

(52) U.S. Cl.
CPC ............. *C08L 53/00* (2013.01); *C08F 20/18* (2013.01); *C08F 20/26* (2013.01); *C08F 26/06* (2013.01); *C08G 63/06* (2013.01); *C08L 2203/20* (2013.01)

(58) Field of Classification Search
CPC .................... H01L 21/0271; G03F 7/0002
See application file for complete search history.

(56) References Cited

U.S. PATENT DOCUMENTS

| 9,123,541 B2 | 9/2015 | Xu et al. |
| 9,574,104 B1 | 2/2017 | Kim et al. |
| 9,768,059 B1 | 9/2017 | Liu et al. |

(Continued)

OTHER PUBLICATIONS

Murphy et al., "Automated Defect and Correlation Length Analysis of Block Copolymer Thin Film Nanopatterns," PLOS ONE, Jul. 24, 2015, 10(7): e0133088, https://doi.org/10.1371/journal.pone.0133088.

(Continued)

*Primary Examiner* — Mark S Kaucher
(74) *Attorney, Agent, or Firm* — Hovey Williams LLP

(57) ABSTRACT

Novel block copolymers ("BCPs") having non-random distributions of comonomers within at least one of the blocks and methods of using those BCPs in directed self-assembly ("DSA") processes are provided. The non-random (e.g., gradient-creating) distributions can be customized in order to concentrate the desired comonomer properties in predetermined areas of the BCP. These BCPs can achieve perpendicular orientation with simple annealing and offer superior long-range ordering and lower defectivity when compared to prior art BCPs. These BCPs can be incorporated into compositions that simultaneously offer the benefits of high-χ and rapid thermal-annealing kinetics while maintaining similar or improved guide process windows when compared to prior art BCPs.

21 Claims, 3 Drawing Sheets

(56) References Cited

U.S. PATENT DOCUMENTS

| | | | |
|---|---|---|---|
| 2003/0185741 A1* | 10/2003 | Matyjaszewski | B82Y 10/00 |
| | | | 423/445 R |
| 2011/0294958 A1* | 12/2011 | Ahn | C08F 293/00 |
| | | | 525/267 |
| 2013/0273330 A1 | 10/2013 | Wang et al. | |
| 2014/0039122 A1* | 2/2014 | Mestach | C08F 2/001 |
| | | | 524/745 |
| 2014/0378592 A1* | 12/2014 | Trefonas, III | G03F 7/0002 |
| | | | 524/317 |
| 2015/0197594 A1 | 7/2015 | Xu et al. | |
| 2016/0122571 A1 | 5/2016 | Cheng et al. | |
| 2016/0244581 A1 | 8/2016 | Brink et al. | |
| 2018/0163003 A1 | 6/2018 | Sweat et al. | |
| 2018/0254189 A1 | 9/2018 | Xu | |

OTHER PUBLICATIONS

International Search Report and Written Opinion dated Jan. 9, 2019 in corresponding PCT/US2018/051333 filed Sep. 17, 2018.

* cited by examiner

GRADIENT BLOCK COPOLYMERS FOR DIRECTED SELF-ASSEMBLY

RELATED APPLICATIONS

The present application claims the priority benefit of U.S. Provisional Patent Application Ser. No. 62/624,960, filed Feb. 1, 2018, entitled GRADIENT BLOCK COPOLYMERS FOR DIRECTED SELF-ASSEMBLY, incorporated by reference in its entirety herein.

BACKGROUND OF THE INVENTION

Field of the Invention

The present invention relates to polymers for use in the block copolymer materials used in directed self-assembly processes.

Description of Related Art

The increasing demand of smaller micro-fabricated devices requires a continuous decrease in the feature size of device components. Conventional photolithography techniques become increasingly difficult and costly as the feature size approaches 22 nm and smaller. To keep Moore's law moving forward, non-lithography techniques will become more and more important. An alternative approach to generate nanoscale patterns is directed self-assembly ("DSA") of block copolymers ("BCPs"), which can feasibly provide highly ordered patternable morphologies such as lamellae and cylinders at a molecular level (<20 nm).

Currently, the use of DSA for generating lines and spaces utilizing conventional polystyrene ("PS") and poly(methylmethacrylate) block copolymer ("PS-b-PMMA") has shown to be in the critical dimension range of 12-20 nm pitch. A range of methods using both chemoepitaxy and graphoepitaxy pre-patterning process flows have been successful for creating both lines and spaces ("lamellae") and contact holes ("cylinders"). In contrast, the resolution limit for single patterning 193 nm immersion scanners is 37 nm for dense lines and spaces and 40 nm for contact openings.

Typical DSA process flows incorporate several layers. DSA of BCPs is typically performed on an organic, neutral "brush" layer. This brush layer is usually a random copolymer of styrene and methyl methacrylate ("PS-r-PMMA") that has been cured over a long period of time. The block copolymer DSA formulations are then coated on top of the brush layer and annealed. The annealing process causes the block copolymer to arrange itself into alternating organized structures. Optionally, a bottom anti-reflective coating is used to control reflection control of a pre-pattern. This pre-pattern is often formed by standard photolithography techniques, such as the patterning of a photoresist. Etch block layers are also included under the DSA layers to facilitate the pattern transfer process (a silicon- or metal-containing hardmask ("HM") such as $SiO_2$ or TiN). Another etch transfer layer, such as spin-on carbon ("SOC"), may also be under the HM layer in the DSA stack.

Current DSA process flows utilize BCP DSA formulations that are coated to a thickness of around 200-1,000 Å and annealed. After successful annealing, one of the blocks can then be etched away with the remaining block used as an etch block for the underlying layers or substrate. In a typical PS-b-PMMA BCP formulation, the PMMA etches faster than PS in dry etch conditions. The PMMA is typically all removed while the PS remains on the substrate.

Standard PS-b-PMMA has an inherent feature size limitation of about ~13 nm because of its low Flory-Huggins interaction parameter ($\chi$), which is the fundamental measure of block incompatibility in BCPs. A Higher $\chi$, which causes stronger phase separation between the blocks in the BCP, is desired for obtaining smaller features, better line-edge roughness, and fewer defects at equilibrium. The properties of the BCP, such as $\chi$, can be altered by the use of comonomers in either block. However, high-$\chi$ BCPs are generally difficult to direct and orientate their DSA morphologies due to the disparate polarities and properties between blocks. Specifically, perpendicular orientation of thin film BCP-DSA is desired for lithographical application to generate useful nanoscopic patterns on substrates, particularly for lamellar-forming BCPs. Most known high-$\chi$ BCPs cannot easily form perpendicularly orientated morphology by simple thermal annealing as does PS-b-PMMA. An additional top-coat layer or solvent annealing is typically used to obtain perpendicular orientation, which can greatly increase the manufacturing cost and complication. This makes incorporating these BCPs into traditional lithographic tracks much more difficult as these are not typical techniques used currently in lithography.

SUMMARY OF THE INVENTION

The present invention broadly provides a method of forming a microelectronic structure, where the method comprises providing a stack comprising a substrate having a surface and one or more optional intermediate layers on the substrate surface. A composition is applied to the intermediate layers, if present, or to the substrate surface, if no intermediate layers are present. The composition comprises a block copolymer comprising a first block and a second block. At least one of the first and second blocks comprises:
  a junction region comprising a first plurality of monomers and positioned nearest the other of the first and second blocks;
  an end region comprising a second plurality of monomers and positioned farthest from the other of the first and second blocks; and
  an intermediate region comprising a third plurality of monomers and positioned intermediate the junction region and the end region, wherein:
    (I) one of the junction, intermediate, and end regions includes a property-adjusting monomer at a concentration that is greater than the respective concentrations of the property-adjusting monomer in each of the other two of the junction, intermediate, and end regions;
    (II) another of the junction, intermediate, and end regions different than the region of (I) includes the property-adjusting monomer at a concentration that is lower than the property-adjusting monomer concentration in the region of (I); and
    (III) another of the junction, intermediate, and end regions different than the regions of (I) and (II):
      lacks the property-adjusting monomer; or
      includes the property-adjusting monomer at a concentration that is lower than the property-adjusting monomer concentration in the region of (I) and lower than the property-adjusting monomer concentration in the region of (II).
Finally, the method comprises causing the composition to self-assemble into a self-assembled layer, wherein the self-assembled layer comprises a first self-assembled region and a second self-assembled region different from the first self-assembled region.

In another embodiment, the invention provides a microelectronic structure comprising a substrate having a surface, one or more optional intermediate layers on the substrate surface, and a layer of a self-assembling composition on the one or more optional intermediate layers, if present, or on the substrate surface, if no intermediate layers are present. The self-assembling composition comprises a block copolymer comprising a first block and a second block. At least one of the first and second blocks comprises:
- a junction region comprising a first plurality of monomers and positioned nearest the other of the first and second blocks;
- an end region comprising a second plurality of monomers and positioned farthest from the other of the first and second blocks; and
- an intermediate region comprising a third plurality of monomers and positioned intermediate the junction region and the end region, wherein:
  - (I) one of the junction, intermediate, and end regions includes a property-adjusting monomer at a concentration that is greater than the respective concentrations of the property-adjusting monomer in each of the other two of the junction, intermediate, and end regions;
  - (II) another of the junction, intermediate, and end regions different than the region of (I) includes the property-adjusting monomer at a concentration that is lower than the property-adjusting monomer concentration in the region of (I); and
  - (III) another of the junction, intermediate, and end regions different than the regions of (I) and (II):
    - lacks the property-adjusting monomer; or
    - includes the property-adjusting monomer at a concentration that is lower than the property-adjusting monomer concentration in the region of (I) and lower than the property-adjusting monomer concentration in the region of (II).

In a further embodiment, the invention is directed towards a block copolymer comprising a first block and a second block. The first block comprises recurring monomers selected from the group consisting of methyl methacrylate, methoxyethyl methacrylate, hydroxyethyl methacrylate, acrylates with polylactic acid side chain moieties, and combinations thereof. The second block comprises:
- a junction region positioned nearest the first block and comprising recurring monomers selected from the group consisting of vinylbiphenyl, 9-(4-vinylbenzyl)-9H-carbazole, methyl styrene, and combinations thereof;
- an end region positioned farthest from the first block; and
- an intermediate region positioned intermediate the junction region and the end region, the intermediate region comprising recurring monomers selected from the group consisting of vinylbiphenyl, 9-(4-vinylbenzyl)-9H-carbazole, methyl styrene, and styrene,
- wherein whichever of the recurring monomers selected from the group consisting of vinylbiphenyl, 9-(4-vinylbenzyl)-9H-carbazole, and methyl styrene is present in the junction region, the individual concentration of the recurring monomer in the junction region is greater than the concentration of that same monomer in the intermediate region.

DETAILED DESCRIPTION OF THE PREFERRED EMBODIMENTS

Figure 1:
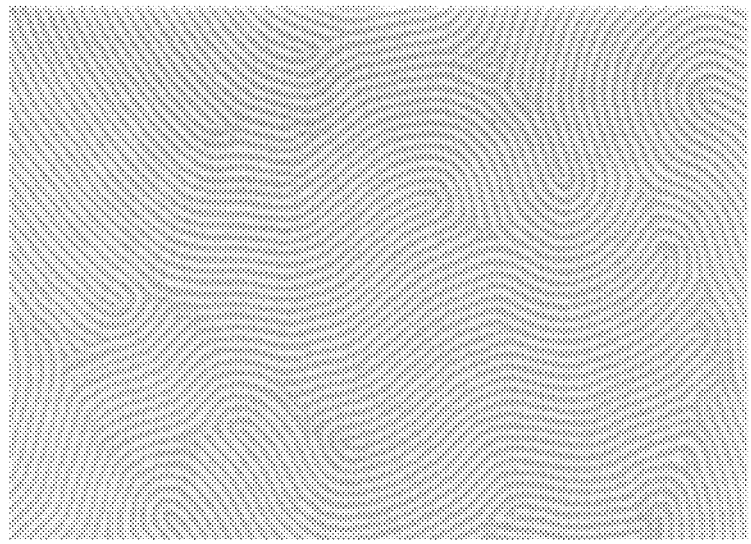
FIG. 1 is a scanning electron microscope (SEM) image of the pattern formed by BCP 1 of Example 1 after being processed as described in Example 4.

The present invention provides block copolymer compositions for use as BCPs in DSA lithography, methods for their use, and microelectronic structures using these compositions. One block of the BCP is replaced by a modified copolymer to create a high-$\chi$ BCP.

In more detail, compositions for use in the present invention are DSA compositions and include a block copolymer (typically a diblock or triblock copolymer) dissolved or dispersed in a solvent system. In general, DSA compositions contain two or more immiscible compounds (e.g., polymer blends) or a self-assembling compound comprising at least two components having distinct (and often opposite) characteristics, such as functionality, polarity, water affinity, etch resistance, etc., which allow segregation (essentially nanophase separation) and alignment of the two compounds or components in a rational manner, as well as selective removal of one compound or component. Block copolymers, as noted above, are particularly well-suited to DSA techniques, as they can be synthesized containing at least two distinct blocks, allowing for each component to align under appropriate conditions, and to be selectively removed after alignment. Suitable block copolymers for use in the present invention should contain two or more blocks of polymers that self-assemble at the appropriate time (e.g., when annealed).

Block Copolymers of the Invention

1. BCP Regions

In one embodiment, the BCPs for use in the invention comprise first and second blocks, with at least one of the first and second blocks being a polymer or copolymer with at least one region modified by inclusion of a property-adjusting monomer. As used herein, a property-adjusting monomer is one that alters some property (e.g., functionality, polarity, water affinity, etch resistance, crosslinking, photosensitivity) of the polymer block in which it is present as compared to that same polymer block if that property-adjusting monomer were not present.

It is preferred that at least some portion of the polymer block including a property-adjusting monomer exhibits a gradual change in monomer composition from predominantly one monomer to predominantly another monomer (i.e., a concentration gradient of those monomers). This monomer concentration gradient, in turn, leads to a gradient in at least one property of the polymer along its length. In some embodiments, both blocks will comprise a copolymer where some or all of the respective copolymers experience a concentration gradient of those property-adjusting monomers. In other embodiments, the other block will be a homopolymer or copolymer without these modifications.

Scheme A provides a general depiction of this polymer structure, showing embodiments where only the first block is modified according to the invention, where only the second block is modified according to the invention, and where both blocks are modified according to the invention, respectively. (The vertical dashed lines denote the break between the polymer blocks.) It will be appreciated that additional blocks could be added, either modified according to the invention or not.

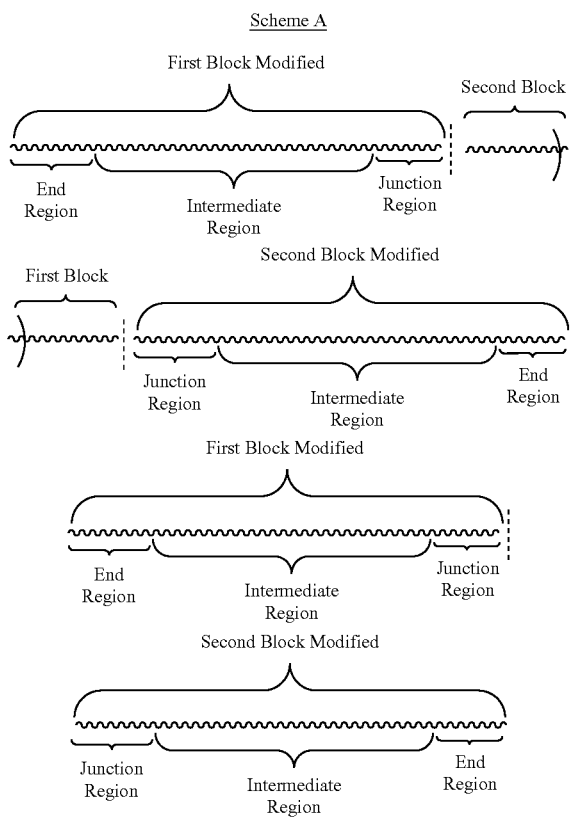

Referring to Scheme A, each block of the BCP that is modified according to the invention preferably includes three regions: a junction region, an intermediate region, and an end region. The junction region is positioned nearest the other block, while the end region is positioned farthest from the other block, and the intermediate region is positioned intermediate the junction region and end region.

Although this can vary depending upon the embodiment, generally the junction region of a block that is modified according to the invention will be present in the block at levels of from about 15% to about 35% on a monomeric basis, preferably from about 20% to about 30% on a monomeric basis, and more preferably from about 20% to about 25% on a monomeric basis. The combination of the intermediate region and end region will take up the remainder of the particular block.

In instances where there is an end region that is distinct from the intermediate region, the end region of that block will be present in that block at levels of from about 15% to about 35% on a monomeric basis, preferably from about 20% to about 30% on a monomeric basis, and more preferably from about 20% to about 25% on a monomeric basis. The combination of the intermediate region and junction region will take up the remainder of the particular block.

In instances where there is both a distinct junction region and a distinct end region in a block, the junction region will generally be present in the block at levels of from about 15% to about 35% on a monomeric basis, preferably from about 20% to about 30% on a monomeric basis, and more preferably from about 20% to about 25% on a monomeric basis. The intermediate region of a block that is modified according to the invention will be present in the block at levels of from about 30% to about 70% on a monomeric basis, preferably from about 40% to about 60% on a monomeric basis, and more preferably from about 50% to about 60% on a monomeric basis. The end region of the block will be present in the block at levels of from about 15% to about 35% on a monomeric basis, preferably from about 20% to about 30% on a monomeric basis, and more preferably from about 20% to about 25% on a monomeric basis.

Preferably, the intermediate region of a block will be present in that block at levels of from about 5% to about 70% on a monomeric basis, preferably from about 20% to about 60% on a monomeric basis, and more preferably from about 50% to about 60% on a monomeric basis. As used herein, "on a monomeric basis" refers to the % of monomers based upon the total number of monomers in the particular region or block being referred to being taken as 100% by weight. For example, if the junction region is present in the first block of a BCP at a level of about 25% on a monomeric basis, that means if the first block has 50,000 monomers, the junction region would comprise about 12,500 (25% of 50,000) monomers. The number of monomers is determined first using GPC to find the molecular weight, and then using that molecular weight to calculate the number of monomers.

As noted above, the block(s) of the BCP that is modified can be done by including property-adjusting monomers that adjust or alter one or more properties of that block(s). However, unlike prior art methods of including property-adjusting monomers in one of the polymer blocks in a random fashion, the present invention does so in a non-random (i.e., controlled) fashion. This additionally makes the distribution of the property-adjusting monomer non-uniform across the entire length of the modified block. In other words, the particular property-adjusting monomer will be loaded in a more highly concentrated manner at one or more points along the length of the modified block (i.e., in one of the end, intermediate, and/or junction regions). Preferably, that increased concentration takes place at one or both of the end region and/or junction region. In one preferred embodiment, the concentration of the property-adjusting monomer will be equal to or greater at one of the end region or junction region than that same monomer at the other of the end region or junction region, depending upon the location where it is desired to modify a particular property. This is shown in Scheme B, where X or Y represents property-adjusting monomers, and the other of X or Y represents a different monomer, such as a typical monomer for use in DSA processes. (For simplicity's sake, the remaining Schemes only show a modification to the second block. However, the same modification could apply to the first block or to both blocks, as shown in Scheme A.)

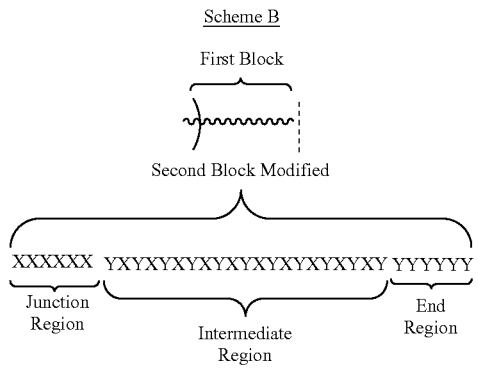

Scheme B

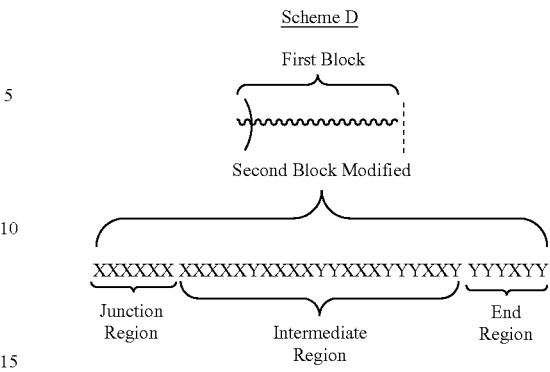

Scheme D

The intermediate region of the modified block could include an increased concentration of the property-adjusting monomer as well, but in a preferred embodiment the property-adjusting monomer is present in the intermediate region at no more than the levels of monomers other than that property-adjusting monomer in that same intermediate region. In another preferred embodiment, the property-adjusting monomer is present as a comonomer with other monomers in the intermediate region, at essentially similar levels. (See Scheme B, for example, where X and Y are comonomers in the intermediate region.) In a further embodiment, the concentration of the property-adjusting monomer substantially uniformly increases or decreases across the length of that intermediate region, thus creating a concentration gradient of the property-adjusting monomer across the intermediate region, as shown in Scheme C.

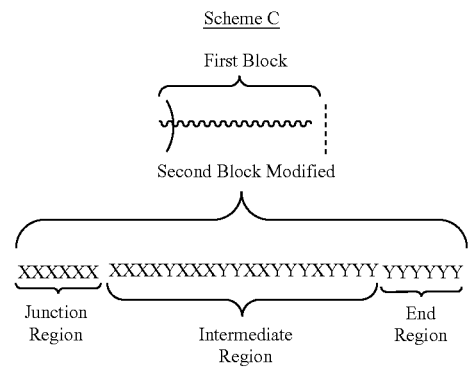

Scheme C

Again, one of X and Y is a property-adjusting monomer, and the other of X or Y is a different monomer, such as a typical monomer for use in DSA processes. If X is the property-adjusting monomer, a decreasing concentration gradient of X is formed along (in either direction) that intermediate region, thus impacting the properties of the polymer block at different locations. If Y is the property-adjusting monomer, an increasing concentration gradient of Y is formed along (in either direction) that intermediate region, thus differently impacting the properties of the polymer block at different locations.

Although three distinct regions are shown, in some embodiments the intermediate region and end region may comprise essentially the same monomeric makeup. For example, in situations where the intermediate region includes a monomer concentration gradient, that gradient could continue through the end region, as shown on Scheme D.

In each of the foregoing Schemes A-D, it is preferred that one of X and Y is a monomer or monomer mixture for a conventional BCP polar block or conventional BCP non-polar block, depending upon which block is being modified. Regardless of the embodiment, it is also preferred that one block is designed to be polar and the other block designed to be non-polar.

The foregoing schematics depict situations where only one property-adjusting monomer is present. However, two or more property-adjusting monomers could also be included, depending upon the particular needs of the end user. It will further be appreciated that varying the concentration of the monomers within the modified block of the BCP as described above allows certain properties to be more localized along the portion of the BCP where they are most advantageous. For instance, high-$\chi$ monomers could be concentrated in the junction region to decrease feature sizes, while low-$T_g$ monomers can be concentrated away from the junction region (and preferably at the end region) so as to improve line edge roughness, LWR, and thermal annealing kinetics, to produce a high-$\chi$ with good performance and low defectivity.

In one embodiment, the concentration of the property-adjusting monomers in the junction region of a block modified according to the invention is at least about 95% on a monomeric basis, preferably at least about 99% on a monomeric basis, and preferably about 100% on a monomeric basis. As described previously, "on a monomeric basis" means that if, for example, the property-adjusting monomer level in the junction region is about 95%, then for every 100 total monomers in that junction region, about 95 are property-adjusting monomers. Additionally, if the concentration of property-adjusting monomer in the junction region is said to be greater than the concentration of property-adjusting monomers in the intermediate region, then the total % of property-adjusting monomers on a monomeric basis in that junction region is greater than the total % of the property-adjusting monomers on a monomeric basis in that intermediate region. So, if the junction region has 100 total monomers and 95 are property-adjusting monomers, and the intermediate region has 250 property-adjusting monomers out of a total of 3,000 total monomers, the concentration of property-adjusting monomers is still greater in the junction region because the total % is higher, even though the absolute number of property-adjusting monomers is higher in the intermediate region.

In another embodiment, the concentration of the property-adjusting monomers in the junction region of a block modified according to the invention is less than about 2% on a monomeric basis, preferably less than about 1% on a monomeric basis, and preferably about 0% on a monomeric basis.

In a further embodiment, the concentration of property-adjusting monomers in the end region of a modified block is at least about 95% on a monomeric basis, preferably at least about 99% on a monomeric basis, and preferably about 100% on a monomeric basis.

In another embodiment, the concentration of the property-adjusting monomers in the end region of a modified block is less than about 2% on a monomeric basis, preferably less than about 1% on a monomeric basis, and preferably about 0% on a monomeric basis.

In a further embodiment, the concentration of property-adjusting monomers in the intermediate region of a modified block is at least about 95% on a monomeric basis, preferably at least about 99% on a monomeric basis, and preferably about 100% on a monomeric basis.

In another embodiment, the concentration of the property-adjusting monomers in the intermediate region of a modified block is less than about 2% on a monomeric basis, preferably less than about 1% on a monomeric basis, and preferably about 0% on a monomeric basis.

It will be appreciated that the each of the foregoing property-adjusting monomer concentrations for a given region can be independently mixed and matched with any of the property-adjusting monomer concentrations for one or both of the other two regions.

2. Monomer Selection a. Polar Block

It is preferred that one of the two polymer blocks is a polar block and includes recurring monomers selected from the group consisting of methacrylates (such as methyl methacrylate, ethyl methacrylate, methoxy ethyl methacrylate, hydroxyethyl methacrylate, hydroxypropyl methacrylate, 3-hydroxypropyl methacrylate, di(ethylene glycol) methyl ether methacrylate, and poly(ethylene glycol) methacrylate), acrylates (such as methyl acrylate, methyl ether acrylate, ethyl acrylate, methoxy ethyl acrylate, di(ethylene glycol) methyl ether acrylate, poly(ethylene glycol) acrylate, and hydroxypropyl acrylate), methacrylic acid, acrylic acid, lactic acid, ethylene oxide, vinyl ester, vinyl amide, and combinations thereof. In most embodiments, any monomers in the polar block that are not property-adjusting monomers will typically be from this group.

There are a number of property-adjusting monomers that are suitable for use in the polar block. Suitable low-$T_g$ monomers include those selected from the group consisting of 2-methoxy ethyl methacrylate, di(ethylene glycol) methyl ether methacrylate, poly(ethylene glycol) methacrylate, methyl acrylate, ethyl acrylate, 2-methoxy ethyl acrylate, di(ethylene glycol) methyl ether acrylate, poly(ethylene glycol) acrylate, and combinations thereof.

Suitable high-$\chi$ monomers for use in the polar block include those selected from the group consisting of polylactic acid, acrylate monomers with polylactic acid side chain moieties, and combinations thereof.

b. Nonpolar Block

It is preferred that one of the two polymer blocks is a nonpolar block and includes recurring monomers selected from styrene, methyl styrenes, vinylbiphenyls, tert-butylstyrene, dimethyl styrenes, trimethylstyrene, methoxy styrene, fluorostyrenes, difluorostyrenes, pentafluorostyrene, trifluoromethylstyrene, benzhydrylstyrene, vinylbenzocyclobutene, vinyl naphthalenes, vinylphenanthrenes, vinylthiophene, vinylanisole, vinylanthracene, vinylpyridines, alkyl styrenes (alkyl: $C_nH_{2n+1}$, n≥1), alkoxy styrenes (alkoxy: $C_nH_{2n-1}O$, n≥1), alkyl vinylbenzyl ethers, vinylbenzyl ether monomers, trimethylsilylstyrene, 9-(4-vinylbenzyl)-9H-carbazole, and combinations thereof. In most embodiments, any monomers in the nonpolar block that are not property-adjusting monomers will typically be from this group.

A number of property-adjusting monomers are also suitable for use in the nonpolar block. For example, suitable low-$T_g$ monomers include those selected from the group consisting of 4-alkyl styrene (alkyl: $C_nH_{2n+1}$, n≥1), 3-alkyl styrene (alkyl: $C_nH_{2n+1}$, where n≥1), 4-alkoxy styrene (alkoxy: $C_nH_{2n+1}O$, where n≥1), 3-alkoxy styrene (alkoxy: $C_nH_{2n+1}O$, where n≥1), 1-(4-tolyloxymethyl)-4-vinylbenzene, alkyl vinylbenzyl ethers, vinylbenzyl ether monomers, and combinations thereof.

When alkyl vinylbenzyl ethers are used, one preferred formula is

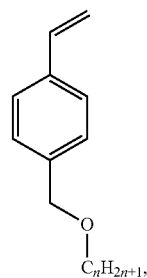

where n≥1, and preferably from 1 to about 6.

When vinylbenzyl ether monomers are used, preferred monomers include those selected from the group consisting of

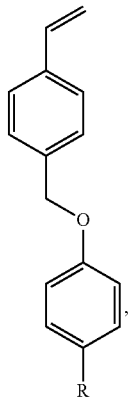

where R is selected from the group consisting of —CH$_3$, —C$_n$H$_{2n+1}$, —OC$_n$H$_{2n+1}$,

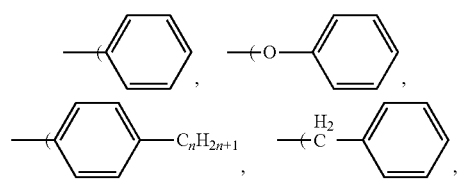

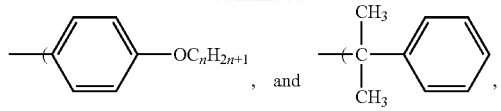

where n≥1, and preferably from 1 to about 6.

In the nonpolar block, suitable high-χ monomers include, but are not limited to, 2-methyl styrene, 3-methyl styrene, 4-methyl styrene, 3-vinylbiphenyl, 4-tert-butylstyrene, 2,4-dimethyl styrene, 3,4-dimethyl styrene, 2,5-dimethyl styrene, 3,5-dimethyl styrene, 2,4,6-trimethylstyrene, 4-methoxy styrene, 4-fluorostyrene, 3-fluorostyrene, 2-fluorostyrene, 2,3-difluorostyrene, 2,4-difluorostyrene, pentafluorostyrene, 4-vinylbiphenyl, 4-benzhydrylstyrene, 4-vinylbenzocyclobutene, 1-vinyl naphthalene, 2-vinyl naphthalene, 2-vinylphenanthrene, 9-vinylphenanthrene, 2-vinylthiophene, 9-vinylanthracene, and combinations thereof.

In the nonpolar block, suitable high-etch-rate monomers include, but are not limited to, vinylbenzocyclobutene, 1-vinylnapthlalate, 2-vinylnapthalate, 2-vinylanthracene, 9-vinylanthracene, 9-vinylphenantrene, 4-trimethylsilylstyrene, and combinations thereof.

In addition to the foregoing monomers, property-adjusting monomers described in the following documents can also be utilized: U.S. Pat. No. 9,123,541 and U.S. Patent Application Publication Nos. 2015/0197594, 2018/0163003, and 2018/0254189, each of which is incorporated herein by reference in its entirety.

In one preferred embodiment, the nonpolar block is the modified block of the BCP. In this case, the main monomer in the nonpolar block may be styrene, but high-χ monomers such as 4-vinylbenzocyclobutene, 4-vinylbiphenyl, and/or 4-methyl styrene, are concentrated near the block junction.

In one preferred embodiment, the polar block of the BCP is a random copolymer of methyl methacrylate and methoxyethyl methacrylate, and the nonpolar block of the BCP is a copolymer modified with 4-vinylbiphenyl and 4-methylstyrene monomers concentrated near the junction region of the two blocks, and 4-methylstyrene, styrene, and 1-(4-tolyloxymethyl)-4-vinylbenzene) concentrated at the end region of the nonpolar block. In this embodiment, a high-χ BCP is produced that can achieve fast phase separation and have long-range ordering. By replacing some of the monomers of the nonpolar block near the junction region with monomers that have a higher χ compared to the other monomers in the nonpolar block, bridge defects can be reduced and etch selectivities increased between the polar and nonpolar blocks by reducing the rate at which the nonpolar block etches.

In another preferred embodiment, the polar block of the BCP is a random copolymer of methyl methacrylate and methoxyethyl monomers with polylactic acid side chains, and the nonpolar block contains (9-(4-vinylbenzyl)-9H-carbazole and 3,4-methylstyrene near or in the junction region, transitioning (preferably in a gradient fashion) to styrene at the end of the nonpolar block. This embodiment creates a higher χ BCP and enables etch selectivity enhancements to the polar block.

In embodiments where there is one modified block, the other block may comprise only one monomer in the block (i.e., be a homopolymer), or it may comprise a random copolymer.

3. Polymerization Methods

Suitable blocks for the BCPs can be created by using controlled radical polymerization techniques, including, but not limited to, reversible addition fragmentation chain transfer (RAFT), and atom transfer radical polymerization (ATRP), stable free radical mediated polymerization (SFRP), nitroxide mediated radical polymerization (NMP), or combinations thereof, with RAFT being the most preferred.

A typical RAFT polymerization uses a radical initiator, a chain transfer agent (i.e. thiocarbonylthio compounds), selected monomers, and a solvent. The polymerization reaction is performed at a suitable temperature in an oxygen-free environment, and then is stopped at a point suitable to generate polymers with a well-controlled molecular weight.

Scheme E shows one preferred RAFT polymerization process that creates a di-block copolymer utilizing a three-step, two-part reaction.

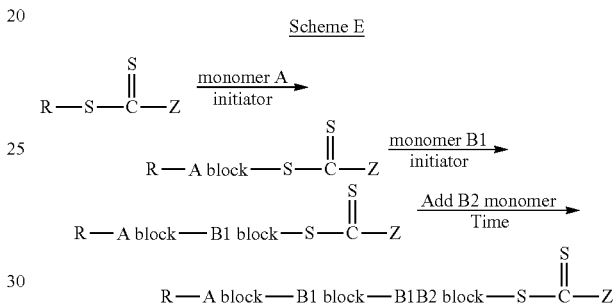

First, one or more monomers (monomer or monomer mixture A, depending upon whether the block is a homopolymer or copolymer) is polymerized via RAFT polymerization in the presence of a radical initiator, a chain transfer agent (such as thiocarbonylthio compounds), and an optional solvent to generate a first polymer or copolymer (polymer A in Scheme E) with the chain transfer agent moiety at one chain end. It will be appreciated that monomer or monomer mixture A can be selected as described previously. Additionally, the selection of monomer or monomer mixture A will be impacted by whether the first block is intended to be polar and non-polar, as well as modified or unmodified.

The first polymer, which is also the first block, is then used as a macromolecular chain transfer agent in a second reaction, to effectuate the polymerization of a second monomer or monomer mixture (monomer or monomer mixture B1) in the presence of a radical initiator and optional solvent to generate a block copolymer (A-B1 di-block copolymer in Scheme E, where the B1 region of the second block can be equated to the junction region described previously).

In the third step, a third monomer or monomer mixture (monomer or monomer mixture B2 in Scheme E) is added to generate a copolymer in the second block. In this instance, the B1B2 region of the second block can be equated to the intermediate region described previously, and this demonstrates an embodiment where no distinct end region was created in that second block. This results in the formation of an A-b-B1-B1B2 block copolymer, where the overall span of the B1B2 region can be a typical copolymer or can be gradient in nature, and the overall B1-B1B2 block is gradient in nature. It will be appreciated that the third monomer or monomer mixture may be added over a period of time or in multiple sub-steps in order to achieve the preferred gradient in the intermediate and end regions.

As was the case with monomer or monomer mixture A, it will be appreciated that monomer or monomer mixture B1 and monomer or monomer mixture B2 can also be selected as described previously. Additionally, the selection of monomer B1 and/or B2 and/or monomer mixture B1 and/or B2 will be impacted by whether this second block is intended to be polar and non-polar, as well as modified or unmodified.

Alternatively, the order of the reaction could be reversed, that is, the second block could be formed first, followed by the first block. In a further embodiment as discussed previously, the reaction could be adjusted so that both the first and second blocks include non-random distribution of monomers and/or including gradient properties across the block. Even more preferably, one block is a polar block, and one block is a nonpolar block. It will be appreciated that one of B1 or B2 can be selected to function as a property-adjusting monomer, depending upon the user's needs. Additionally, there are other BCP monomer sequences that could be achieved using this method, and those sequences can be devised for the particular situation.

Suitable radical initiators the RAFT polymerization method include, but are not limited to, 2,2'-azobis(2-methylpropionitrile) (AIBN), 4,4'-azobis(4-cyanovaleric acid) (ACVA), and 1,1'-azobis(cyclohexanecarbonitrile) (ACHN).

Suitable chain transfer agents include, but are not limited to, 2-cyano-2-propyl benzodithioate, 2-phenyl-2-propyl benzodithioate, 4-cyano-4-(phenylcarbonothioylthio)pentanoic acid, 2-cyano-2-propyl dodecyl trithiocarbonate, and 4-cyano-4-[(dodecylsulfanylthiocarbonyl)sulfanyl] pentanoic acid.

Suitable solvents include, but are not limited to, toluene, 1,4-dioxane, tetrahydrofuran, propylene glycol monomethyl ether acetate (PGMEA), ethyl acetate, propylene glycol monomethyl ether (PGME), and anisole.

4. Inventive Block Copolymer Properties

The inventive block copolymers have a number average molecular weight of from about 1,000 g/mol to about 100,000 g/mol, preferably from about 5,000 g/mol to about 60,000 g/mol, and more preferably from about 10,000 g/mol to about 25,000 g/mol. Preferably, the polydispersity index (PDI) of the inventive BCPs is from about 1.01 to about 1.50, and more preferably from about 1.04 to about 1.25. As used herein, PDI, number average molecular weight, and weight average molecular weight are each determined by GPC, using the following parameters: Mobile phase THF; Column- WATERS Styragel HR4, HR4E, HR 3, 708×300 mm; Flow rate—1.0 ml/min; Detector—RI; Column Temperature 40° C.; Polystyrene Standards used.

The inventive block copolymer has a $\chi$ value that is at least about 1.2 times, and preferably at least about 1.5 times the $\chi$ value of a polystyrene and poly(methyl methacrylate) block copolymer.

Furthermore, in some embodiments, the inventive block copolymer has a $T_g$ (as used herein, determined by Differential Scanning calorimetry) that is at least about 10% lower than (i.e., less than about 90% of), and preferably at least about 20% lower than (i.e., less than about 80% of) the $T_g$ of a polystyrene and poly(methyl methacrylate) block copolymer. In the polar block (e.g., the methacrylate block), that block preferably has a $T_g$ of from about 0° C. to about 120° C., and preferably from about 30° C. to about 100° C. In the nonpolar block (e.g., styrene block), that block preferably has a $T_g$ of from about 0° C. to about 100° C., and preferably from about 60° C. to about 85° C.

The ratio of the first and second blocks in the block copolymer varies, depending on the desired self-assembly microstructures and properties of the polymer. However, typically the volume ratio of first block to second block is from about 10:90 to about 90:10. "Volume ratio" as used herein is the ratio of the "volume" of each block of the polymer (where the volume is calculated by taking the molecular weight of that block of the polymer) and dividing it by the density of that block of the polymer. When the structure being formed is cylinder, the volume ratio will typically be from about 80:20 to about 60:40, or from 40:60 to 20:80. When the structure being formed is lamellae, the volume ratio will typically be from about 40:60 to about 60:40.

Inventive Compositions

The block copolymer is formulated into a composition comprising one or more polymers dissolved or dispersed in a solvent system, along with optional ingredients including surfactants, acid or base catalysts, and/or crosslinkers. Preferred compositions will preferably have solids content of from about 0.1% to about 5%, more preferably from about 0.1% to about 2%, based upon the total weight of the composition taken as 100% by weight.

In one embodiment, one or more block copolymers may be blended into a final formulation with one or more other block copolymers and dissolved or dispersed in a solvent system, along with optional ingredients including surfactants, acid or base catalysts, and/or crosslinkers. Blending of the BCPs may further decrease defectivity, improve patterning, and allow the BCPs to form varying structures during the anneal process.

Methods of Using Inventive Compositions In one embodiment, the high-$\chi$ BCP is used in a DSA patterning scheme. In this process, the BCP is coated onto a series of underlayers and annealed to form the desired pattern. This pattern can be used in conjunction with pre-patterns, such as over a patterned photoresist or hardmask, or alone.

The BCP layer can be formed by any known application method, with one preferred method being spin-coating at speeds from about 500 to about 2500 rpm, preferably from about 1000 to about 1500 rpm, for a time period of from about 30 to about 90 seconds, preferably from about 50 to about 60 seconds. After the BCP layer is applied, it is preferably heated to a temperature from about 100° C. to about 300° C., and more preferably from about 110° C. to about 250° C. and for a time period of from about 30 seconds to about 24 hours, preferably from about 60 seconds to about 600 seconds, to anneal the material. Alternatively, the BCP layer could be annealed using an $N_2$ blanket, which assists with stability, or the layer could be annealed in air. A second bake stage may be used to crosslink the material after microphase separation. The thickness of the BCP layer after baking is preferably from about 5 nm to about 80 nm, more preferably from about 10 nm to about 50 nm based on the molecular weight of each polymer block.

The BCP layer is coated on top of a series of one or more underlayers selected from the group comprising bottom anti-reflective coatings, neutral brush layers, hardmask neutral layers (HM NLs), hardmasks, carbon-rich (e.g., spin-on carbon), or other layers. In some cases, a single layer, such as an HM NL, can perform the function of multiple layers, such as those of the bottom anti-reflective coatings, the neutral brush layer, and the hardmask.

1. Optional Hardmask Layer

The hardmask layer can be formed by any known application method, with one preferred method being spin-coating at speeds from about 1,000 to about 5,000 rpm, preferably from about 1,250 to about 1,750 rpm, for a time period of from about 30 to about 120 seconds, preferably from about 45 to about 75 seconds. Suitable hardmask layers are preferably high silicon content materials selected from the group consisting of silanes, siloxanes, and silsesquioxanes. Exemplary hardmask layers will generally compromise a polymer dissolved or dispersed in a solvent system, along with the following optional ingredients: surfactants, acid or base catalysts, and crosslinkers. Preferred compositions will preferably have solids content of from about 0.1% to about 70%, more preferably from about 0.5% to about 10%, and even more preferably from about 1% to about 2% by weight, based upon the total weight of the composition taken as 100% by weight. After the hardmask is applied, it is preferably heated to a temperature from about 100° C. to about 300° C., and more preferably from about 150° C. to about 250° C. and for a time period of from about 30 seconds to about 120 seconds, preferably from about 45 seconds to about 60 seconds, to evaporate solvents. The thickness of the hardmask layer after baking is preferably from about 5 nm to about 50,000 nm, more preferably from about 5 nm to about 1000 nm, and even more preferably from about 10 nm to about 100 nm. The hardmask layer should have an etch rate at least 0.75 times that of the block copolymer in a fluorine-rich plasma atmosphere and at least 5 times slower than the SOC in an oxygen-rich plasma etch atmosphere. The hardmask thickness should not be affected by the solvent when applying the BCP solution.

Some commercial hardmask layers can be used. Other preferred hardmask layers contain a copolymer of monomers selected from the group containing phenethyltrimethoxysilane (PETMS), 2-(carbomethoxy)ethyltrimethoxysilane (CMETMS), tetraethoxysilane (TEOS), methyltrimethoxysilane, and phenyltrimethoxysilane.

2. Optional Carbon-Rich Layer

The carbon-rich layer can be formed by any known application method, with one preferred method being spin-coating at speeds from about 1,000 to about 5,000 rpm, preferably from about 1,250 to about 1,750 rpm, for a time period of from about 30 to about 120 seconds, preferably from about 45 to 75 seconds. The term "carbon-rich" refers to layers formed from compositions comprising greater than about 50% by weight carbon, preferably greater than about 70% by weight carbon, and more preferably from about 75 to about 80% by weight carbon, based upon the total solids in the composition taken as 100% by weight. Suitable carbon-rich layers are selected from the group consisting of spin-on carbon layers (SOC), amorphous carbon layers, and carbon planarizing layers. Exemplary carbon-rich layers will generally compromise a polymer dissolved or dispersed in a solvent system, along with the following optional ingredients: acid and/or base quenchers, catalysts, crosslinking agents, and surface modification additives. Preferred compositions will be suitable for forming thick layers and preferably have solids content of from about 0.1% to about 70%, more preferably from about 5% to about 40%, and even more preferably from about 10% to about 30% by weight, based upon the total weight of the composition taken as 100% by weight. After the carbon-rich composition is applied, it is preferably heated to a temperature from about 100° C. to about 300° C., and more preferably from about 160° C. to about 250° C. and for a time period of from about 30 seconds to about 120 seconds, preferably from about 45 seconds to about 60 seconds, to evaporate solvents. The thickness of the carbon-rich layer after baking is preferably from about 10 nm to about 50,000 nm, more preferably from about 100 nm to about 5000 nm, and even more preferably from about 500 nm to about 1500 nm.

The substrate is preferably a semiconductor substrate, such as silicon, SiGe, $SiO_2$, $Si_3N_4$, SiON, aluminum, tungsten, tungsten silicide, gallium arsenide, geimanium, tantalum, tantalum nitride, $Ti_3N_4$, hafnium, $HfO_2$, ruthenium, indium phosphide, coral, black diamond, glass, or mixtures of the foregoing. Optional intermediate layers may be formed on the substrate prior to processing.

3. Alternative Application Methods a. Graphoepitaxy

While the previously-described BCP application method is a preferred embodiment, it will be appreciated that there are a number of variations that could be carried out as well. These variations are described and shown in detail in U.S. Patent Application No. 2013/0273330, incorporated by reference. For example, the invention could be utilized in lithography-assisted (e.g., graphoepitaxy) self-assembly. In summary, a stack is prepared as described above, using a substrate, optional intermediate layer (e.g., carbon-rich layer), and hardmask layer. An imaging layer is formed on the cured hardmask layer following conventional methods. Suitable photosensitive compositions for use as the imaging layer include any composition that can be patterned upon exposure to at least about 1 $mJ/cm^2$ radiation, such as photoresists, anti-reflective imaging layers, and the like.

The imaging layer can then be post-application baked ("PAB") at a temperature of at least about 80° C., and preferably from about 100° C. to about 140° C., for time periods of from about 10 seconds to about 120 seconds (preferably from about 30 seconds to about 60 seconds). The thickness of the imaging layer is preferably from about 10 nm to about 300 nm, more preferably from about 20 nm to about 150 nm, and even more preferably from about 30 nm to about 100 nm.

That imaging layer can then be patterned, for example, by exposure to radiation (e.g., light in the case of optical lithography) of the appropriate wavelength, followed by development of the unexposed portions of the imaging layer, again following conventional methods. For example, the imaging layer could be exposed using a mask positioned above the imaging layer. The mask has open areas designed to permit radiation (hv) to pass through the mask and contact the imaging layer to yield exposed portions of the imaging layer that are rendered insoluble in solvent (when using a negative-tone photoresist). The remaining solid portions of the mask are designed to prevent radiation from contacting the imaging layer in certain areas to yield unexposed portions of the imaging layer that remain solvent soluble. Those skilled in the art will readily understand that the arrangement of open areas and solid portions is designed based upon the desired pattern to be formed in the imaging layer, although the present method is particularly suited for dark-field exposure where the majority of the imaging layer is shielded from radiation to form raised features such as lines and pillars.

After exposure, the imaging layer is preferably subjected to a post-exposure bake ("PEB") at a temperature of from about 80° C. to about 150° C., more preferably from about 100° C. to about 130° C., for a time period of from about 30 seconds to about 60 seconds. Upon exposure, the portions of the imaging layer that are exposed to radiation are rendered insoluble in organic (preferably non-alkaline) solvent developer. The exposed imaging layer is then contacted with solvent to remove the unexposed portions to form the desired "pre-pattern" in the imaging layer. Alternatively, when using a positive-tone photoresist, the exposed portions of the imaging layer can be rendered soluble in aqueous developer (e.g., an alkaline developer) or solvent during the exposure process, in which case, the removal process is reversed from what is described above. That is, the exposed portions are removed during development to form the pattern (not shown).

In either embodiment, at least about 95% of the unexposed (or exposed, as the case may be) portions of the imaging layer will preferably be removed by developer, more preferably at least about 99%, and even more preferably about 100% will be removed. Suitable non-alkaline solvent developers include n-butyl acetate, n-butyl propionate, isobutyl butyrate, and/or ketones (e.g., 2-heptanone). Suitable alkaline developers for positive tone imaging layers are organic or inorganic alkaline solutions such as potassium hydroxide (KOH) and tetramethyl ammonium hydroxide (TMAH), and preferably comprise an aqueous solution of TMAH at a concentration of 0.26N or lower. Some of these developers are commercialized under the tradenames PD523AD (available from Moses Lake Industries, Inc., Moses Lake, Wash.), MF-319 (available from Shipley, Mass.), MF-320 (available from Shipley), and NMD3 (available from TOK, Japan).

Thus, pre-pattern formation results in portions of the hardmask layer underneath the imaging layer being uncovered or exposed when those selected portions of the imaging layer are removed from the stack. The resulting pre-pattern preferably comprises raised features (e.g., lines, pillars, square islands, or combinations thereof) formed on the hardmask layer. These features are chemically identical to the exposed portions of the imaging layer and are each defined by respective sidewalls and respective top surfaces. It will be appreciated that in alternative embodiments, any other suitable patterning process may be used to pattern the imaging layer and form raised features, including multiple patterning processes, as well as immersion lithography. As mentioned above, it will also be appreciated that a positive-tone resist or photosensitive material could also be used, instead of the negative-tone imaging layer described herein. In that case, the unexposed portions of the imaging layer remain insoluble, while the exposed portions are rendered soluble and are removed with developer. Other patterning methods may also be used, including emerging technologies, such as imprint lithography, nano-imprint lithography, hot embossing lithography, and stamping pattern transfer.

These technologies use a patterned mold to transfer patterns instead of relying on photolithographic patterning, as described above.

Regardless of the embodiment, once the desired pre-pattern is formed, a DSA composition according to the invention can be applied to the patterned stack, such that it flows into the spaces between the raised features (i.e., directly adjacent the hardmask), and adjacent the sidewalls of the raised features. In one or more embodiments, the self-assembling composition can also overcoat the top surfaces of the raised features. However, in other embodiments, the self-assembling composition preferably does not overcoat the top of the raised features. In other words, the self-assembling composition is deposited between the raised features and adjacent the feature sidewalls but is absent from the top surfaces of the raised features. As a result, the top surface of the raised features remains open to be easily removed via solvent removal or etching, without the need for an etch-back step or other modification of the self-assembling layer to expose the pre-pattern. The DSA composition can then be self-assembled or annealed as described above to yield first self-assembled regions and second self-assembled regions in the self-assembled or annealed layer, with one of the first or second self-assembled regions being adjacent the raised feature sidewalls, and the other of the first or second self-assembled regions segregated away from the raised features.

Either of the first or second self-assembled regions can then be removed to generate a pattern. For example, the first self-assembled region can then be removed to generate a pattern in the DSA layer on the patterned stack, followed by transferring this pattern down into the hardmask and carbon-rich intermediate layer. It will be appreciated that instead of the first self-assembled region, the second self-assembled region could be removed instead. Regardless, the resulting pattern is eventually transferred down into the substrate. The pattern will typically be comprised of features such as lines, spaces, cylinders, and/or holes. Advantageously, these features will have an average (mean) respective feature size of less than about 20 nm, preferably less than about 15 nm, more preferably less than about 10 nm, and even more preferably from about 1 nm to about 10 nm. The term "feature size," as used herein, refers to the average (mean) width of the features as measured on an SEM cross-section of the stack (thus in the case of holes the width is the same as the hole diameter).

b. Chemoepitaxy I

In another embodiment, chemoepitaxy could be used to guide the DSA pattern. In one chemoepitaxy process flow, a stack is prepared comprising a substrate, optional intermediate layer, switchable underlayer, and imaging layer, as described above. A pre-pattern is created in the imaging layer, either using the method described previously, or any other conventional method. Thus, pre-pattern formation results in portions of the underlayer beneath the imaging layer being uncovered or exposed when those selected portions of the imaging layer are removed from the stack. The remaining portions of the imaging layer adjacent the underlayer serve as a mask for surface modification of the underlayer. In one or more embodiments, the imaging layer is patterned using optical lithography and a developer (e.g., alkaline developer) or solvent rinse. Alternatively, the imaging layer is patterned using another suitable method, followed by contact with a developer solution (e.g., alkaline developer) or solvent. Regardless, the exposed portions of the underlayer are contacted with a developer solution (separately or during developer rinse). The remaining portions of the imaging layer are then removed (e.g., with solvent), yielding the underlayer having surface-modified regions and non-modified regions, where the surface-modified regions correspond to those portions of the underlayer that were uncovered during patterning of the imaging layer. Advantageously, contact with the developer (and particularly with an alkaline developer) changes the surface energy of the underlayer. In one or more embodiments, the surface energy is increased and causes the surface-modified regions of the underlayer to lose their ability to act as a neutral layer and induce alignment during the self-assembly process. However, the non-modified regions of the underlayer, which remained covered by the imaging layer during patterning and developer contact, still retain their neutral layer properties. Thus, the surface-modified regions correspond to non-aligning areas while the non-modified regions correspond to aligning areas on the underlayer. The active aligning areas therefore have the ability to become guiding structures for pattern formation during self-assembly.

c. Chemoepitaxy II

In a second chemoepitaxy process flow, a stack is prepared comprising a substrate, optional intermediate layer, and a switchable underlayer. In this process, the switchable underlayer is exposed directly, yielding an underlayer having surface-modified regions and non-modified regions, where the surface-modified regions correspond to those that were exposed. Advantageously, the exposure changes the surface energy of the underlayer. In one or more embodiments, the surface energy is increased and causes the surface-modified regions of the underlayer to lose their ability to act as a neutral layer and induce alignment during the self-assembly process. However, the non-modified regions of the underlayer, which remained covered by the imaging layer during patterning and developer contact, still retain their neutral layer properties. Thus, the surface-modified regions correspond to non-aligning areas while the non-modified regions correspond to aligning areas on the underlayer. The active aligning areas therefore have the ability to become guiding structures for pattern formation during self-assembly.

A DSA layer is then formed directly on top of the surface-modified underlayer, such that there is direct contact between the DSA layer and surface-modified regions and non-modified regions. The DSA layer is then self-assembled as described above to allow the components to self-assemble. Because of the surface modification, the self-assembling layer will only self-assemble into first self-assembled regions and second self-assembled regions in those portions of the DSA layer that are adjacent the non-modified areas of the underlayer. In other words, portions of the DSA layer adjacent the surface-modified areas of the underlayer do not separate or segregate into a pattern during annealing or self-assembly and are "unassembled" or "non-aligned." It will be appreciated that alternatively, the surface-modified regions and non-modified regions could be reversed, that is, that the surface-modified regions may allow the DSA layer to self-assemble, while the non-modified regions may cause the DSA layer to be "unassembled" or "non-aligned." One of the first or second self-assembled regions can then be selectively removed, followed by etching the resulting pattern into the underlayer and optional intermediate layer. This pattern is eventually transferred down into the substrate. In embodiments where a switchable underlayer is not utilized, an intermediate layer is required that will form modified and non-modified areas or regions, and the rest of the process would proceed as described above.

Regardless of the application method, it will be appreciated that in each of the foregoing methods, self-assembly or annealing results in nanophase separation in the DSA layer, which permits the formation of nanometer-sized patterns generally not achievable using conventional optical lithography techniques. It will also be appreciated that although the present methods illustrate formation of at least two distinct annealed or self-assembled regions in the DSA layer, it is envisioned that additional DSA materials could be formulated that are capable of separation into more than two distinct phases, including third and fourth annealed or self-assembled regions. A $L_0$ range of from about 12 to about 40 nm can be achieved by lamellae-forming BCPs. Additionally, line-space features of from about 6 to about 20 nm (identified by SEM) can be achieved. A size range of from about 6-nm to about 20-nm cylinder structures, e.g., holes or pillars, can also be achieved by the inventive cylinder-forming block copolymers. Perpendicular orientation of these BCPs can be achieved by thermal annealing alone a short time.

The developed BCPs provide the advantages of balanced surface energy between the polymer blocks, and tunable $\chi$ and glass transition temperature ($T_g$). In one embodiment, the balanced surface energy between the polymer blocks enables the BCP to achieve perpendicular orientation by simple thermal annealing, without the need for solvent annealing or a top-coat. The $\chi$ value can be tuned up to achieve a $L_0$ (BCP natural pitch) as low as 12 nm for lamellar-structured BCPs and hole/pillar size as small as 6 nm for cylinder-structured BCPs. In embodiments where a $T_g$-adjusting monomer is utilized, the $T_g$ of the BCP can be tuned in the range of 10-90° C., at least 20° C. lower than those of PS-b-PMMA. Enhanced polymer chain mobility facilitated by decreasing the $T_g$ of the BCPs can also improve the kinetics of BCP self-assembly during thermal annealing.

Additional advantages of the various embodiments of the invention will be apparent to those skilled in the art upon review of the disclosure herein and the working examples below. It will be appreciated that the various embodiments described herein are not necessarily mutually exclusive unless otherwise indicated herein. For example, a feature described or depicted in one embodiment may also be included in other embodiments but is not necessarily included. Thus, the present invention encompasses a variety of combinations and/or integrations of the specific embodiments described herein.

As used herein, the phrase "and/or," when used in a list of two or more items, means that any one of the listed items can be employed by itself or any combination of two or more of the listed items can be employed. For example, if a composition is described as containing or excluding components A, B, and/or C, the composition can contain or exclude A alone; B alone; C alone; A and B in combination; A and C in combination; B and C in combination; or A, B, and C in combination.

The present description also uses numerical ranges to quantify certain parameters relating to various embodiments of the invention. It should be understood that when numerical ranges are provided, such ranges are to be construed as providing literal support for claim limitations that only recite the lower value of the range as well as claim limitations that only recite the upper value of the range. For example, a disclosed numerical range of about 10 to about 100 provides literal support for a claim reciting "greater than about 10" (with no upper bounds) and a claim reciting "less than about 100" (with no lower bounds).

EXAMPLES

The following examples set forth methods in accordance with the invention. It is to be understood, however, that these examples are provided by way of illustration and nothing therein should be taken as a limitation upon the overall scope of the invention.

Example 1

Synthesis of BCP 1

In the first step, methyl methacrylate ("MMA," 40 grams, Sigma Aldrich, St Louis, Mo.), 2-methoxyethyl methacrylate ("MEMA," 20 grams, Sigma Aldrich, St Louis, Mo.), 2-cyano-2-propyl benzodithioate (0.227 grams, Strem Chemicals Inc., Newburyport, Mass.), 2,2'-azobis(2-methylpropionitrile) (0.025 grams, Sigma Aldrich, St Louis, Mo.), and toluene (50 grams, Sigma Aldrich, St Louis, Mo.) were added to a round bottom flask and purged for 30 minutes with nitrogen. The reaction was heated at 60° C. for 16 hours before being cooled to room temperature, diluted with acetone (30 grams, Sigma Aldrich, St Louis, Mo.), and precipitated into hexanes (800 mL, Alfa Aesar, Ward Hill, Mass.). The resulting solid was collected by vacuum filtration and dried under vacuum overnight at 45° C. Finally, 11.8 grams of the resulting polymer ("P(MMA-r-MEMA)") were collected and analyzed by GPC to be 13.2 kg/mol relative to polystyrene ("PS") standards with a polydispersity index ("PDI") of 1.12.

In the second step, 1.5 grams of the P(MMA-r-MEMA) from Step 1 were mixed with 1.67 grams of 4-vinylbiphenyl ("VBP," Sino-Biochemical, Shanghai, China), 2.55 grams of 4-methyl styrene ("MS," Sigma Aldrich, St Louis, Mo.), 2 milligrams of 2,2'-azobis(2-methylpropionitrile), and 4 grams of toluene in a first 100-ml round bottom flask. The solution was purged with nitrogen for 30 minutes and heated to 75° C. for 1 hour 37 minutes. During the reaction, a second 100-ml round bottom flask was prepared with 2.8 grams of styrene ("S," Sigma Aldrich, St Louis, Mo.), 7.08 grams of 4-methyl styrene, and 5.4 grams of 1-(4-tolyloxymethyl)-4-vinylbenzene (Wuxi Vsparkle International Trading Co., Ltd, Yiking, Jiangsu, China). This solution was purged with nitrogen for 30 minutes then an air-free transfer was carried out to the 100-ml round bottom containing the first mixture. The combined mixture was then allowed to react at 75° C. for 2 additional hours after which the reaction mixture was cooled to room temperature. The reaction mixture was then diluted with 5 grams of acetone and precipitated into a 1:1 (v/v) mixture of cyclohexane (Alfa Aesar, Ward Hill, Mass.) to hexane (Alfa Aesar, Ward Hill, Mass.). The resulting solid was collected by vacuum filtration and dried under vacuum overnight at 45° C. Finally, 2.5 grams of BCP 1 was collected and analyzed by GPC to be 22.4 kg/mol relative to PS standards with a PDI of 1.10.

Example 2

Synthesis of BCP 2

In the first step, 19.02 grams of methyl methacrylate, 1.30 grams of 2-hydroxyethyl methacrylate ("HEMA," Sigma Aldrich, St Louis, Mo.), 0.161 gram of 2-cyano-2-propyl benzodithioate, 15 milligrams of 2,2'-azobis(2-methylpropionitrile), and 30 grams of ethyl acetate (Alfa Aesar, Ward Hill, MA) were added to a round bottom flask and purged for 30 minutes with nitrogen. The reaction was heated at 60° C. for 16 hours before being cooled to room temperature, diluted with 30 grams of acetone, and precipitated into 450 milliliters of hexanes. The resulting powder was collected by vacuum filtration and dried under vacuum overnight at 45° C. Finally, 10.8 grams of the resulting polymer ("P(MMA-r-HEMA)") were collected and analyzed by GPC to be 12.6 kg/mol relative to PS standards with a PDI of 1.10.

In the second step, 1.5 grams of the P(MMA-r-HEMA) from Step 1 were mixed with 0.77 gram of 9-(4-vinylbenzyl)-9H-carbazole ("VBK," Brewer Science, Rolla Mo.), 1.81 grams of 3,4-methyl styrene ("MS," TCI America, Portland, Oreg.), 4 milligrams of 2,2'-azobis(2-methylpropionitrile), and 4 grams of cyclohexanone (Sigma Aldrich, St Louis, Mo.) were added to a round bottom flask and purged for 30 minutes with nitrogen. The reaction was heated to 80° C. for 1 hour and 37 minutes. During this time, 10.34 grams of styrene were added to another round bottom flask followed by purging for 30 minutes with nitrogen. At the end of the 1 hour and 37 minutes, this flask was added to the first flask by an air-free transfer. The flask was then heated to 90° C. and was reacted for 2 additional hours, after which it was cooled to room temperature and precipitated in a 1:2 (v:v) ratio of hexane (Alfa Aesar, Ward Hill, Mass.) and cyclohexane. The resulting powder was collected by vacuum filtration and dried under vacuum overnight at 26° C. Finally, 3.28 grams of powder were collected and analyzed by GPC to be 29.8 kg/mol relative to PS standards with a PDI of 1.21.

In the third step, polylactic acid ("PLA") polymerization was accomplished by adding 0.9 gram 3,6-dimethyl-1,4-dioxane-2,5-dione (Sigma Aldrich, St Louis, Mo.) to 3.00 grams of the BCP generated in Step 2 of this Example to an oven-heated flask that had been cooled under dry nitrogen. Next, 55 milliliters of dichloromethane (Sigma Aldrich, St Louis, Mo.) were added, and the solution was stirred until all solids dissolved. After solids dissolution, 0.6 milliliter of a 5% (v/v) solution of 1,8-diazabicyclo[5.4.0]undec-7-ene (Sigma Aldrich, St Louis, Mo.) in dichloromethane was added, and the reaction stirred for 30 minutes under dry nitrogen at room temperature. The polymer was precipitated by pouring the solution into acidified methanol (3 milliliters of 1M HCl (Sigma Aldrich, St Louis, Mo.) in 300 milliliters of methanol (Sigma Aldrich, St Louis, Mo.)). The resulting polymer was collected by gravity filtration and dried overnight under vacuum at 26° C. The yield for the polymerization was approximately 2.99 grams. The resulting BCP 2 was analyzed by GPC to be 34.5 kg/mol relative to PS standards with a PDI of 1.13.

Example 3

Reference Platform

In the first step, a mixed solution of 504 milligrams of 2-cyano-2-propyl dodecyl trithiocarbonate (Sigma-Aldrich, St. Louis, Mo.), 40 grams of methyl methacrylate, and 28 milliliters of toluene was prepared in a round-bottom flask and stirred at room temperature for 15 minutes under nitrogen atmosphere. The prepared solution was transferred into a Schlenk reaction flask, and 24.0 milligrams of 2,2'-azobis(2-methylpropionitrile) were added afterwards. The Schlenk reaction flask was de-gassed by three consecutive freeze-evacuate-thaw cycles and sealed in vacuum. The polymerization was carried out at 60° C. for 16 hours. A viscous reaction mixture was obtained and diluted with 50 milliliters of dichloromethane. The polymer product was precipitated in 1 liter of methanol and collected by filtration. The polymer solid obtained was further purified by re-dissolving in 50 milliliters of dichloromethane and precipitating into 1 liter of methanol, after which it was dried in a vacuum oven at 45° C. for 24 hours. The polymer product, PMMA with a trithiocarbonate end group, was analyzed by GPC with a Mn of 12,500, Mw of 14,200, and PDI of 1.14.

In the second step, 3.0 grams of the PMMA prepared in Step 1, 4.00 grams of styrene, 4.01 grams of 4-vinylbenzocyclobutene (Sigma-Aldrich, St. Louis, Mo.), and 0.94 grams of methylstyrene in 4 grams of toluene was prepared in a round-bottom flask and stirred at room temperature for 15 minutes under nitrogen atmosphere. The solution was transferred into a Schlenk reaction flask, and 4.1 milligrams of 2,2'-azobis(2-methylpropionitrile) were added. The Schlenk reaction flask was then de-gassed by three repeated freeze-evacuate-thaw cycles and sealed in vacuum. The polymerization was carried out at 90° C. for 17 hours. The reaction mixture obtained was diluted with 50 milliliters of dichloromethane and precipitated in 0.8 liter of methanol. The polymer collected by filtration was further purified by re-dissolving in 50 milliliters of dichloromethane and precipitating into 0.8 liter of methanol, after which it was dried in a vacuum oven at 45° C. for 24 hours. The resulting powder was determined to have a Mn of 20,900, a Mw of 23.700, and a PDI of 1.13, as determined by GPC, using the following parameters: Mobile phase THF; Column—WATERS Styragel HR4, HR4E, HR 3, 708×300 mm; Flow rate-1.0 ml/min; Detector—RI; Column Temperature 40° C.; Polystyrene Standards used.

Example 4

Self-Assembly Testing

Figure 2:
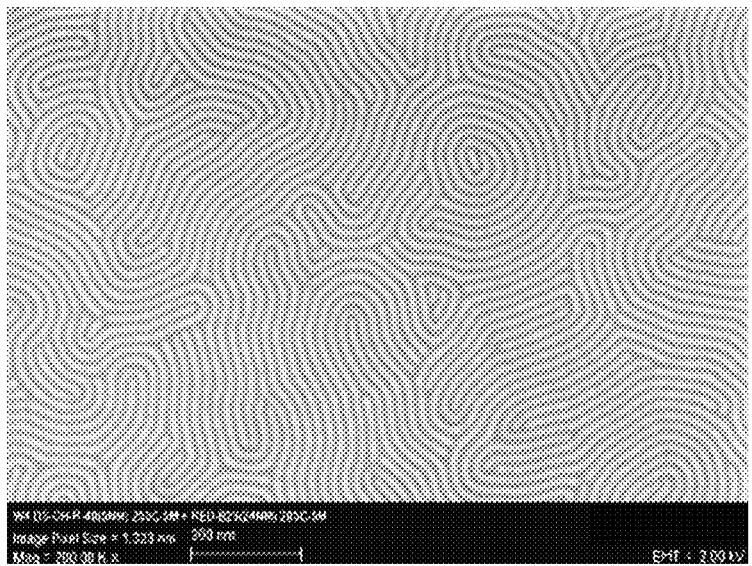
FIG. 2 is an SEM image of the pattern formed by BCP 2 of Example 2 after being processed as described in Example 4.

Silicon wafers were prepared for self-assembly by first coating with a 0.5 wt % solution of hydroxyl-terminated random copolymer of P(S-r-MMA) comprising 30% PS and 70% MMA (Tokyo Chemical Industries America, Portland, Oreg.) in propylene glycol monomethyl ether acetate ("PGMEA," Heraeus Precious Metals North America, Vandalia, Ohio). The resulting ~12-nm-thick film was annealed at 250° C. for 5 minutes and then stripped with PGMEA to remove unreacted brush. The treated wafer was then coated with the particular test BCP (1.2 wt % in PGMEA) and baked at 180° C. for 5 minutes to complete the self-assembly process. The resulting BCP film was then etched in an oxygen plasma using the following parameters: 100 W power, 60 mtorr chamber pressure, and 30 sccm of $O_2$ for 5 seconds. FIG. 1 shows SEM images using BCP 1 from Example 1, and FIG. 2 shows SEM images using BCP 2 from Example 2, both at 200 kx magnification.

BCP 1 was tested and compared to the performance of other platforms. Table 1 shows the results of this testing, which indicate that the BCPs that utilize junction modifications according to the present invention exhibited a reduction in defects and improved correlation length without negatively affecting Line Edge Roughness ("LER"). These were each determined using ImageJ software with a plugin, as explained by Murphy J N, Harris K D, Buriak J M (2015), Automated Defect and Correlation Length Analysis of Block Copolymer Thin Film Nanopatterns. PLoS ONE 10(7): e0133088. https://doi.org/10.1371/journal.pone.0133088, incorporate by reference herein.

TABLE 1

Performance comparison of various BCPs

| Platform | $L_0$ | Correlation Length | LER | Defect Density |
|---|---|---|---|---|
| BCP 1 | 19 nm | 198.5 nm | 2.5 3σ | 85.19/μm² |
| BCP 2 | 19 nm | 69.8 nm | 2.3 3σ | 146/μm² |
| Example 3 (Comparative) | 19 nm | 54.5 nm | 2.7 3σ | 169.89/μm² |
| PS-b-P(MMA-r-LA)* | 19 nm | 76.5 nm | 2.4 3σ | 141.63/μm² |

*A comparative BCP described in US Patent Application Publication No. 2018/0163003.

Example 5

BCP Alignment

Figure 3:
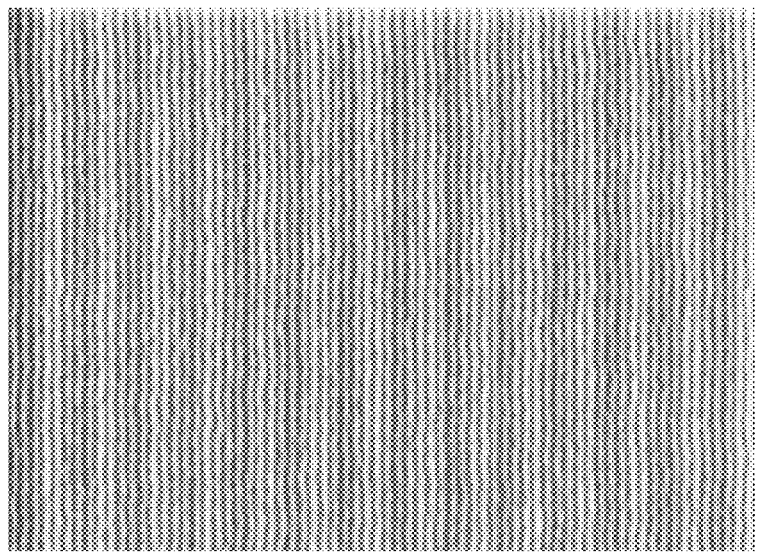
FIG. 3 is an SEM image of the alignment achieved by BCP 1 of Example 1 after being processed as described in Example 5.

Vinaigrette patterned xPS chips (obtained from imec, www.imec-int.com) were coated with a 0.5 wt % solution of hydroxyl-terminated random copolymer of P(S-r-MMA) comprising 50% styrene and 50% MMA in PGMEA (Brewer Science, Rolla, Mo.). The resulting ~12-nm-thick film was annealed at 250° C. for 5 minutes and then stripped with PGMEA to remove unreacted brush. The treated chip was then coated with BCP 1 from Example 1 (1.2 wt % in PGMEA) and baked at 180° C. for 10 minutes to complete the self-assembly process. The resulting BCP film was then etched in an oxygen plasma using the following parameters: 100 W power, 60 mtorr chamber pressure, and 30 sccm of $O_2$ for 5 seconds. FIG. 3 shows the junction-modified BCP 1 of Example 1 aligned on the wafer. These results demonstrate that junction modifications can be used to align, reduce the number of defects, and improve the correlation length.

Example 6

BCP Alignment

Figure 4:
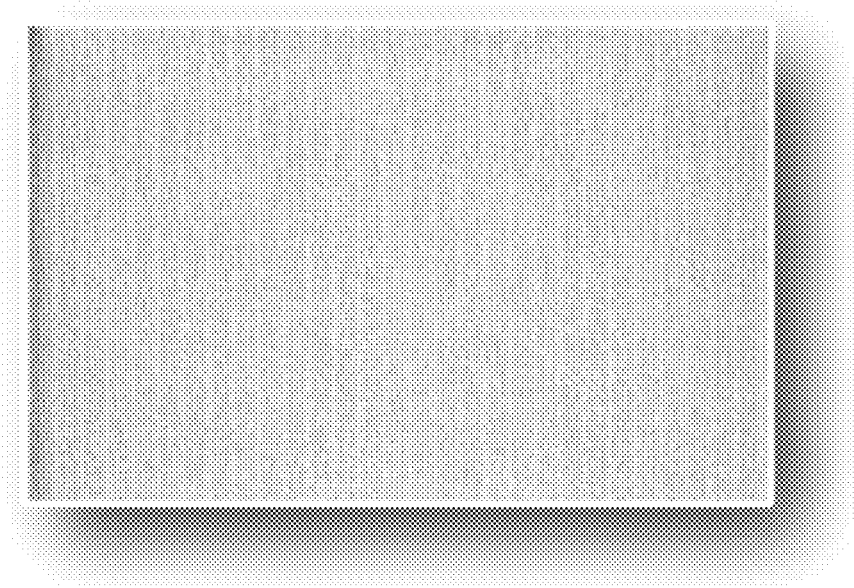
FIG. 4 is an SEM image of the alignment achieved by BCP 1 of Example 1 (96-nm pitch with 4× pitch multiplication) after being processed as described in Example 6.
Figure 5:
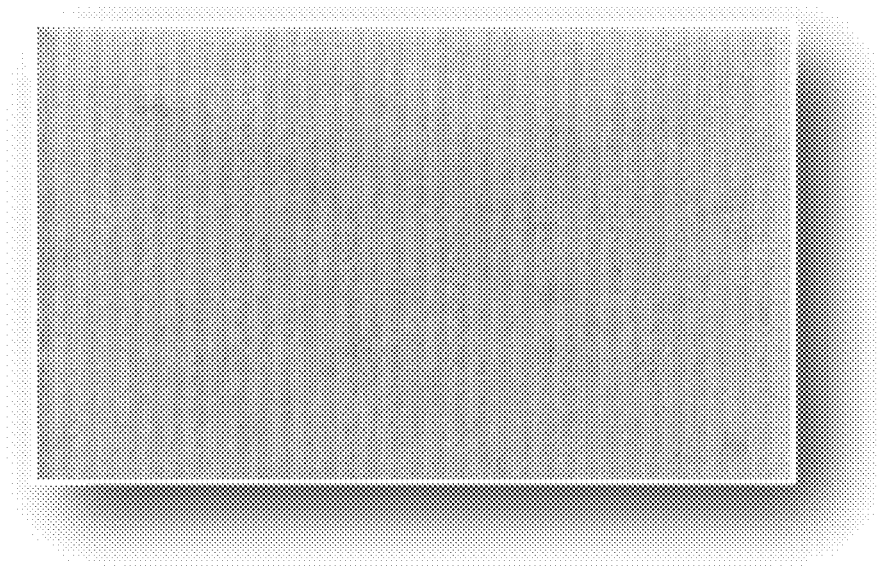
FIG. 5 is an SEM image of the alignment achieved by BCP 1 of Example 1 (76-nm pitch with 4× pitch multiplication) after being processed as described in Example 6.

A 300-mm silicon wafer with 13-nm SiN deposition was coated with crosslinkable polystyrene (1% solids in PGMEA, Brewer Science, Rolla, Mo.). The resulting ~7.5-nm-thick film was annealed at 315° C. for 5 minutes. The substrate was then patterned using an ASML 193i exposure tool with exposure conditions of 18-22.5 mJ with a focus of 0.04 nm. The photoresist type was AIM5484 (a 193 immersion photoresist, obtained from JSR) with a thickness of 105 nm baked at 120° C. for 60 seconds. Trim etch conditions were used to target 0.5*$L_0$ for the final guide size. Lines printed at 35 nm were trimmed to 15 nm in this etch step. The substrate was then coated with a 0.5 wt % solution of hydroxyl-terminated random copolymer of P(S-r-MMA) comprising 50% styrene and 50% MMA in PGMEA (Brewer Science, Rolla, Mo.). The resulting ~12-nm-thick film was annealed at 250° C. for 5 minutes and then rinsed with PGMEA for 30 seconds. The treated chip was then coated with BCP 1 of Example 1 (1.2 wt % in PGMEA) by spin coating at 1,500 rpm and baked at 180° C. for 5 minutes to complete the self-assembly process. The resulting BCP film was then etched in an oxygen plasma using the following parameters: 100 W power, 60 mtorr chamber pressure, and 30 sccm of $O_2$ for 5 seconds. FIGS. 4 and 5 show the junction-modified BCP 1 of Example 1 aligned on the wafer. Table 2 shows various process parameter changes and the resulting alignment, determined by SEM fingerprints. These results demonstrate that junction modifications can be used to align, reduce the number of defects, and improve the correlation length.

TABLE 2

Effect of variable changes on % alignment

| Variable | Variable change | Exposure latitude | Depth of focus | Percent alignment |
|---|---|---|---|---|
| PS-r-PMMA % PS (4x pitch multiplication) | 40% | 34.3% | 0.2 | 81% |
| | 45% | 34.3% | 0.2 | 79% |
| | 50% | 26.1% | 0.2 | 69% |
| PS-r-PMMA % PS (5x pitch multiplication) | 50% | 29.7% | 0.2 | 81% |
| | 60% | 25.6% | 0.2 | 64% |
| Anneal time | 1 min | 25% | 0.24 | 22% |
| | 5 min | 30% | 0.34 | 65% |
| | 10 min | 30% | 0.34 | 70% |
| | 100 min | 30% | 0.34 | 75% |
| Anneal temperature | 180° C. | 24.4% | 0.34 | 66% |
| | 200° C. | 29.3% | 0.36 | 73% |

We claim:
1. A method of forming a microelectronic structure, said method comprising:
   providing a stack comprising:
      a substrate having a surface; and
      one or more optional intermediate layers on said substrate surface;

applying a composition to said one or more intermediate layers, if present, or to said substrate surface, if no intermediate layers are present, said composition comprising a block copolymer comprising a first block and a second block, at least one of said first and second blocks comprising:
  a junction region comprising a first plurality of monomers and positioned nearest the other of said first and second blocks;
  an end region comprising a second plurality of monomers and positioned farthest from the other of said first and second blocks; and
  an intermediate region comprising a third plurality of monomers and positioned intermediate said junction region and said end region, said intermediate region further comprising a second monomer selected from the group consisting of styrene, methyl styrenes, vinylbiphenyls, tert-butylstyrene, dimethyl styrenes, trimethylstyrene, methoxy styrene, fluorostyrenes, difluorostyrenes, pentafluorostyrene, trifluoromethylstyrene, benzhydryl styrene, vinylbenzocyclobutene, vinyl naphthalenes, vinylphenanthrenes, vinylthiophene, vinylanisole, vinylanthracene, vinylpyridines, alkyl styrenes, alkoxy styrenes, alkyl vinylbenzyl ethers, vinylbenzyl ether monomers, trimethylsilylstyrene, 9-(4-vinylbenzyl)-9H-carbazole, and combinations thereof, wherein:
    (I) said end region includes a property-adjusting monomer at a concentration that is greater than the property-adjusting monomer concentration in the intermediate region and greater than the property-adjusting monomer concentration in the junction region, said property-adjusting monomer is selected from the group consisting of 4-alkyl styrenes, 3-alkyl styrenes, 4-alkoxy styrenes, 3-alkoxy styrenes, 1-(4-tolyloxymethyl)-4-vinylbenzene, alkyl vinylbenzyl ethers, vinylbenzyl ether monomers, 2-methyl styrene, 3-vinylbiphenyl, 4-tert-butylstyrene, 2,4-dimethyl styrene, 3,4-dimethyl styrene, 2,5-dimethyl styrene, 3,5-dimethyl styrene, 2,4,6-trimethylstyrene, 4-methoxy styrene, 4-fluorostyrene, 3-fluorostyrene, 2-fluorostyrene, 2,3-difluorostyrene, 2,4-difluorostyrene, pentafluorostyrene, 4-vinylbiphenyl, 4-benzhydrylstyrene, 4-vinylbenzocyclobutene, 1-vinyl naphthalene, 2-vinyl naphthalene, 2-vinylphenanthrene, 9-vinylphenanthrene, 2-vinylthiophene, 9-vinylanthracene, vinylbenzocyclobutene, 1-vinylnapthlalate, 2-vinylnapthalate, 2-vinylanthracene, 9-vinylanthracene, 9-vinylphenantrene, 4-trimethylsilylstyrene, and combinations thereof;
    (II) said intermediate region includes said property-adjusting monomer at a concentration that is lower than the property-adjusting monomer concentration in the end region; and
    (III) said junction region:
      lacks said property-adjusting monomer; or
      includes said property-adjusting monomer at a concentration that is lower than said property-adjusting monomer concentration in the end region and lower than said property-adjusting monomer concentration in the intermediate region; and
  causing said composition to self-assemble into a self-assembled layer, wherein said self-assembled layer comprises a first self-assembled region and a second self-assembled region different from said first self-assembled region.

2. The method of claim 1, wherein the end region (I) comprises only said property-adjusting monomer.

3. The method of claim 1, wherein the junction region (III) comprises a second monomer different from said property-adjusting monomer.

4. The method of claim 1, wherein said second monomer present in the intermediate region (II) is greater than the concentration of the second monomer in the end region (I).

5. The method of claim 1, wherein said intermediate region has a length extending from the end region and the junction region, and the property-adjusting monomer concentration decreases gradiently across that length.

6. The method of claim 1, wherein the other of said first and second blocks is a homopolymer.

7. The method of claim 1, wherein the other of said first and second blocks comprises:
  a second junction region comprising a fourth plurality of monomers and positioned nearest the at least one of said first and second blocks;
  a second end region comprising a fifth plurality of monomers and positioned farthest from the at least one of said first and second blocks; and
  a second intermediate region comprising a sixth plurality of monomers and positioned intermediate said second junction region and said second end region, wherein:
    (IV) one of said second junction, second intermediate, and second end regions includes a third monomer at a concentration that is greater than the respective concentrations of said third monomer in each of the other two of said second junction, second intermediate, and second end regions;
    (V) another of said second junction, second intermediate, and second end regions different than the region of (IV) includes said third monomer at a concentration that is lower than the third monomer concentration in the region of (IV); and
    (VI) another of said second junction, second intermediate, and second end regions different than the regions of (IV) and (V) that:
      lacks said third monomer; or
      includes said third monomer at a concentration that is lower than said third monomer concentration in the region of (IV) and lower than said third monomer concentration in the region of (V).

8. The method of claim 7, wherein:
  (IV) is said second junction region, (V) is said second intermediate region, and (VI) is said second end region; or
  (IV) is said second end region, (V) is said second intermediate region, and (VI) is said second junction region.

9. The method of claim 1, further comprising removing one of said self-assembled regions to yield a pattern in said self-assembled layer.

10. The method of claim 1, wherein an intermediate layer is present, said intermediate layer comprising a pre-pattern comprising a plurality of raised features, said raised features being spaced apart and each being defined by respective sidewalls and a top surface, wherein said self-assembling composition is applied directly on top of said intermediate layer in spaces between said raised features.

11. The method of claim 10, wherein said plurality of raised features are formed by:

applying a photosensitive composition to form an imaging layer on any other intermediate layer, if present, or on said substrate surface, if no other intermediate layers are present; and patterning said imaging layer to yield said pre-pattern, before applying said composition to said imaging layer.

12. The method of claim 11, wherein said patterning comprises:

exposing said imaging layer to radiation to yield exposed and unexposed portions of said imaging layer; and contacting said imaging layer with a developer so as to remove one of said exposed or unexposed portions.

13. The method of claim 1, wherein at least one intermediate layer is present, said intermediate layer being selected from the group consisting of hardmask layers and neutral layers, and wherein said intermediate layer comprises a surface having surface-modified regions and non-modified regions, said first and second self-assembled regions being adjacent said non-modified regions.

14. The method of claim 13, wherein before applying said composition to said intermediate layer, said surface-modified regions and non-modified regions are formed by:

forming an imaging layer on said intermediate layer;

patterning said imaging layer to yield a pre-pattern, wherein said patterning comprises selectively removing portions of said imaging layer to uncover portions of said intermediate layer;

contacting said uncovered portions of intermediate layer with a developer or solvent to yield said surface-modified regions; and removing remaining portions of said imaging layer from said intermediate layer to yield said non-modified regions.

15. The method of claim 13, wherein before applying said composition to said intermediate layer, said surface-modified regions and non-modified regions are formed by selectively exposing said intermediate layer to radiation.

16. A method of forming a microelectronic structure, said method comprising:

providing a stack comprising:
a substrate having a surface; and
one or more optional intermediate layers on said substrate surface;

applying a composition to said one or more intermediate layers, if present, or to said substrate surface, if no intermediate layers are present, said composition comprising a block copolymer comprising a first block and a second block, wherein said first block is polar and said second block is nonpolar, said second blocks comprising:

a junction region comprising a first plurality of monomers and positioned nearest said first blocks;

an end region comprising a second plurality of monomers and positioned farthest from said first blocks; and an intermediate region comprising a third plurality of monomers and positioned intermediate said junction region and said end region, said intermediate region further comprising a second monomer selected from the group consisting of styrene, methyl styrenes, vinylbiphenyls, tert-butylstyrene, dimethylstyrenes, trimethylstyrene, methoxy styrene, fluorostyrenes, difluorostyrenes, pentafluorostyrene, trifluoromethylstyrene, benzhydrylstyrene, vinylbenzocyclobutene, vinyl naphthalenes, vinylphenanthrenes, vinylthiophene, vinylanisole, vinylanthracene, vinylpyridines, alkyl styrenes, alkoxy styrenes, alkyl vinylbenzyl ethers, vinylbenzyl ether monomers, trimethylsilylstyrene, 9-(4-vinylbenzyl)-9H-carbazole, and combinations thereof, wherein:

(I) said end region includes a property-adjusting monomer at a concentration that is greater than the property-adjusting monomer concentration in the intermediate region and greater than the property-adjusting monomer concentration in the junction region, said property-adjusting monomer is selected from the group consisting of 4-alkyl styrenes, 3-alkyl styrenes, 4-alkoxy styrenes, 3-alkoxy styrenes, 1-(4-tolyloxymethyl)-4-vinylbenzene, alkyl vinylbenzyl ethers, vinylbenzyl ether monomers, 2-methyl styrene, 3-vinylbiphenyl, 4-tert-butyl styrene, 2,4-dimethyl styrene, 3,4-dimethyl styrene, 2,5-dimethyl styrene, 3,5-dimethyl styrene, 2,4,6-trimethyl styrene, 4-methoxy styrene, 4-fluorostyrene, 3-fluorostyrene, 2-fluorostyrene, 2,3-difluorostyrene, 2,4-difluorostyrene, pentafluorostyrene, 4-vinylbiphenyl, 4-benzhydrylstyrene, 4-vinylbenzocyclobutene, 1-vinyl naphthalene, 2-vinyl naphthalene, 2-vinylphenanthrene, 9-vinylphenanthrene, 2-vinylthiophene, 9-vinylanthracene, vinylbenzocyclobutene, 1-vinylnapthlate, 2-vinylnapthalate, 2-vinylanthracene, 9-vinylanthracene, 9-vinylphenantrene, 4-trimethylsilylstyrene, and combinations thereof;

(II) said intermediate region includes said property-adjusting monomer at a concentration that is lower than the property-adjusting monomer concentration in the end region; and (III) said junction region:
lacks said property-adjusting monomer; or
includes said property-adjusting monomer at a concentration that is lower than said property-adjusting monomer concentration in the end region and lower than said property-adjusting monomer concentration in the intermediate region; and causing said composition to self-assemble into a self-assembled layer, wherein said self-assembled layer comprises a first self-assembled region and a second self-assembled region different from said first self-assembled region.

17. The method of claim 1, wherein said causing said composition to self-assemble by heating comprises heating said composition to a temperature of from about 100° C. to about 300° C.

18. The method of claim 1, said causing said composition to self-assemble occurs without solvent annealing.

19. The method of claim 1, wherein said self-assembled layer is on said one or more intermediate layers, if present, or on said substrate surface, if no intermediate layers are present.

20. The method of claim 1, wherein said first self-assembled region comprises said first block and said second self-assembled region comprises said second block.

21. A method of forming a microelectronic structure, said method comprising:

providing a stack comprising:
a substrate having a surface; and
one or more optional intermediate layers on said substrate surface;

applying a composition to said one or more intermediate layers, if present, or to said substrate surface, if no intermediate layers are present, said composition comprising a block copolymer comprising a first block and a second block, at least one of said first and second blocks comprising:

a junction region comprising a first plurality of monomers and positioned nearest the other of said first and second blocks;

an end region comprising a second plurality of monomers and positioned farthest from the other of said first and second blocks; and an intermediate region comprising a third plurality of monomers and positioned intermediate said junction region and said end region, said intermediate region further comprising a second monomer selected from the group consisting of styrene, methyl styrenes, vinylbiphenyls, tert-butylstyrene, dimethyl styrenes, trimethylstyrene, methoxy styrene, fluorostyrenes, difluorostyrenes, pentafluorostyrene, trifluoromethylstyrene, benzhydrylstyrene, vinylbenzocyclobutene, vinyl naphthalenes, vinylphenanthrenes, vinylthiophene, vinylanisole, vinylanthracene, vinylpyridines, alkyl styrenes, alkoxy styrenes, alkyl vinylbenzyl ethers, vinylbenzyl ether monomers, trimethylsilylstyrene, 9-(4-vinylbenzyl)-9H-carbazole, and combinations thereof, wherein:

said end region includes a property-adjusting monomer at a concentration that is greater than the property-adjusting monomer concentration in the intermediate region and greater than the property-adjusting monomer concentration in the junction region, said property-adjusting monomer being selected from the group consisting of 4-alkyl styrenes, 3-alkyl styrenes, 4-alkoxy styrenes, 3-alkoxy styrenes, 1-(4-tolyloxymethyl)-4-vinylbenzene, alkyl vinylbenzyl ethers, vinylbenzyl ether monomers, 2-methyl styrene, 3-vinylbiphenyl, 4-tert-butyl styrene, 2,4-dimethyl styrene, 3,4-dimethyl styrene, 2,5-dimethyl styrene, 3,5-dimethyl styrene, 2,4,6-trimethylstyrene, 4-methoxy styrene, 4-fluorostyrene, 3-fluorostyrene, 2-fluorostyrene, 2,3-difluorostyrene, 2,4-difluorostyrene, pentafluorostyrene, 4-vinylbiphenyl, 4-benzhydrylstyrene, 4-vinylbenzocyclobutene, 1-vinyl naphthalene, 2-vinyl naphthalene, 2-vinylphenanthrene, 9-vinylphenanthrene, 2-vinylthiophene, 9-vinylanthracene, vinylbenzocyclobutene, 1-vinylnapthlalate, 2-vinylnapthalate, 2-vinylanthracene, 9-vinylanthracene, 9-vinylphenantrene, 4-trimethylsilyl styrene, and combinations thereof;

said intermediate region includes said property-adjusting monomer at a concentration that is lower than the property-adjusting monomer concentration in the end region; and said junction region:

lacks said property-adjusting monomer; or includes said property-adjusting monomer at a concentration that is lower than said property-adjusting monomer concentration in the end region and lower than said property-adjusting monomer concentration in the intermediate region; and causing said composition to self-assemble into a self-assembled layer by heating said composition to at least about the glass transition temperature of said block copolymer, wherein during said heating, said first block and second block segregate and align to form the self-assembled layer and, wherein said self-assembled layer comprises a first self-assembled region and a second self-assembled region different from said first self-assembled region.

* * * * *